(12) United States Patent
Takeuchi et al.

(10) Patent No.: US 12,002,646 B2
(45) Date of Patent: Jun. 4, 2024

(54) ION GENERATION DEVICE, ION GENERATION METHOD, AND ION GENERATION PROGRAM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Takeshi Takeuchi, Kawasaki (JP); Akiko Kakutani, Yokohama (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 408 days.

(21) Appl. No.: 17/445,337

(22) Filed: Aug. 18, 2021

(65) Prior Publication Data

US 2021/0383996 A1 Dec. 9, 2021

Related U.S. Application Data

(63) Continuation of application No. PCT/JP2020/015448, filed on Apr. 6, 2020.

(30) Foreign Application Priority Data

Apr. 10, 2019 (JP) ................. 2019-074962

(51) Int. Cl.
*H01J 27/02* (2006.01)
*H05H 7/08* (2006.01)
*H05H 9/00* (2006.01)

(52) U.S. Cl.
CPC ............ *H01J 27/024* (2013.01); *H05H 7/08* (2013.01); *H05H 2007/082* (2013.01); *H05H 9/00* (2013.01)

(58) Field of Classification Search
CPC ........ H01J 27/022; H01J 27/024; H05H 7/08; H05H 9/00; H05H 2007/085
See application file for complete search history.

(56) References Cited

U.S. PATENT DOCUMENTS

2007/0178678 A1* 8/2007 Hatem .................... C23C 14/48
438/513
2017/0318657 A1 11/2017 Aoki et al.

FOREIGN PATENT DOCUMENTS

JP 61-019036 A 1/1986
JP 01-137549 A 5/1989
(Continued)

OTHER PUBLICATIONS

International Search Report dated Jul. 7, 2020 in PCT/JP2020/015448 filed on Apr. 6, 2020, 3 pages.
(Continued)

*Primary Examiner* — David E Smith
(74) *Attorney, Agent, or Firm* — Oblon, McClelland, Maier & Neustadt, L.L.P.

(57) ABSTRACT

A technique for outputting heterologous ions having the same per-nucleon energy at different timings by using one ion source is provided.

An ion generation device includes: an ion generation energy setter that causes first ions and second ions generated by ionization in a vacuum chamber to be emitted in a mixed state from an opening; an electric-field voltage adjuster that imparts a same predetermined per-nucleon energy to each of the first and second ions by applying electric potential formed between the opening and extraction electrodes while switching the electric potential between first and second electric-field voltages; and an excitation current adjuster that causes the first and second ions to be outputted at different timings by supplying a coil of a separation electromagnet (Continued)

with an excitation current while switching the excitation current between first and second excitation currents.

8 Claims, 7 Drawing Sheets

(56) References Cited

FOREIGN PATENT DOCUMENTS

| | | | | |
|---|---|---|---|---|
| JP | 02-025157 U | | 2/1990 | |
| JP | 08-77961 A | | 3/1996 | |
| JP | 09-097769 A | | 4/1997 | |
| JP | 09097769 A | * | 4/1997 | ....... H01L 21/76221 |
| JP | 2009-524907 A | | 7/2009 | |
| JP | 2017-139074 A | | 8/2017 | |
| JP | 2019-139943 A | | 8/2019 | |
| KR | 10-2010-0069257 A | | 6/2010 | |
| KR | 2010069257 A | * | 6/2010 | |

OTHER PUBLICATIONS

Kageyama et al., "Present Status of HIMAC injectors at NIRS", Proceedings of the 7th Annual Meeting of Particle Accelerator Society of Japan, 2010, 9 pages (with English Machine Translation).

* cited by examiner $$W_x = wA_x = q_x V_x \quad [q_x = eZ_x] \quad \cdots (1)$$

$$V_x = wA_x/eZ_x \quad \cdots (2)$$

$$W_x = \frac{1}{2} M_x v_x^2 \quad [M_x = mA_x] \quad \cdots (3)$$

$$v_x = \sqrt{2W_x/M_x} \quad \cdots (4)$$

$$F = q_x v_x B_x = M_x v_x^2/R \quad \cdots (5)$$

$$B_x = \frac{M_x}{q_x R} v_x = \frac{M_x}{q_x R}\sqrt{\frac{2W_x}{M_x}} = \frac{\sqrt{2M_x W_x}}{q_x R}$$

$$= \frac{\sqrt{2mw}}{e}\left(\frac{A_x}{Z_x}\right)\frac{1}{R} \quad \cdots (6)$$

FIG. 2

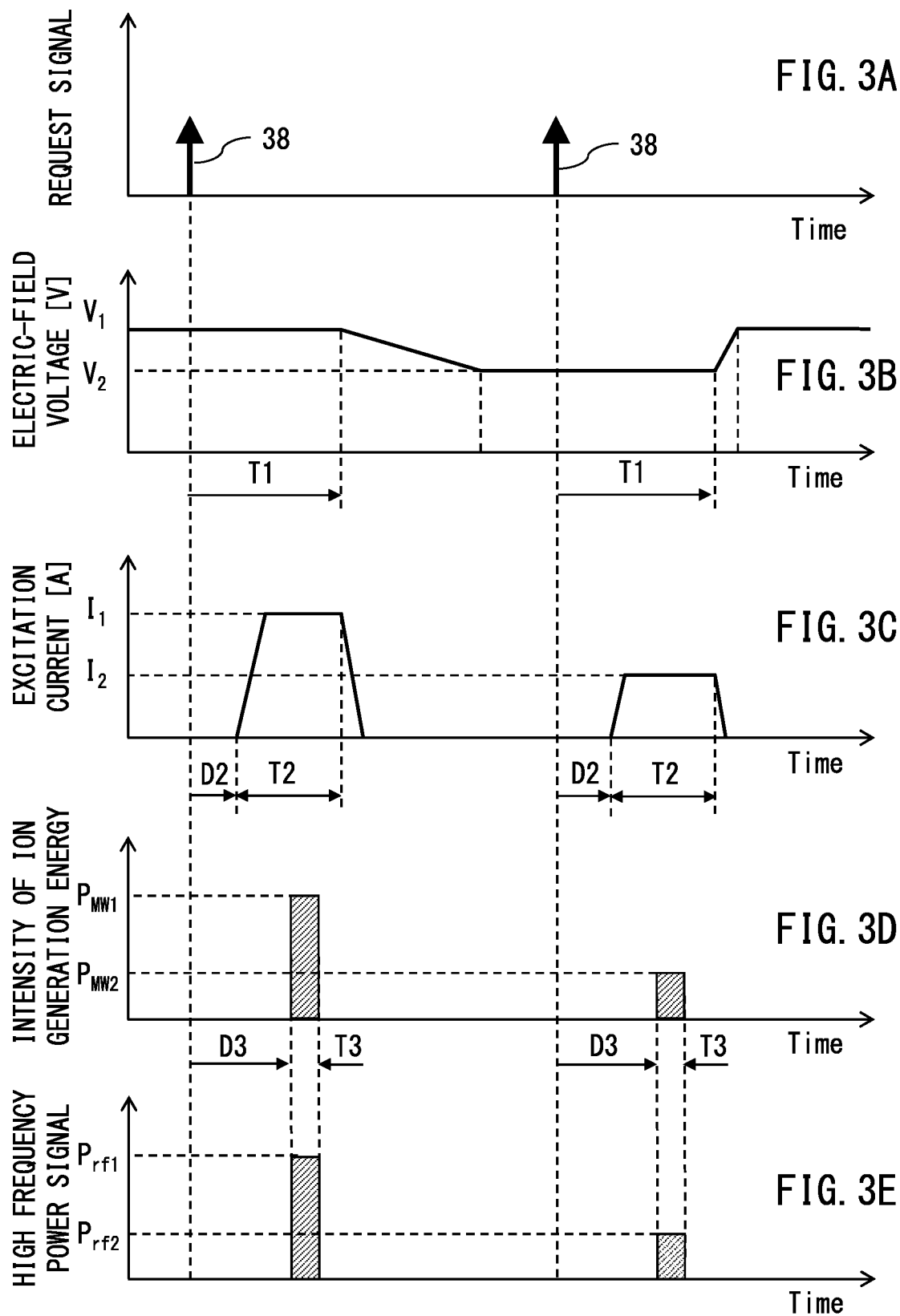

ION GENERATION DEVICE, ION GENERATION METHOD, AND ION GENERATION PROGRAM

CROSS-REFERENCE TO RELATED APPLICATIONS

This application is a Continuation Application of No. PCT/JP2020/015448, filed on Apr. 6, 2020, and the PCT application is based upon and claims the benefit of priority from Japanese Patent Application No. 2019-074962, filed on Apr. 10, 2019, the entire contents of which are incorporated herein by reference.

TECHNICAL FIELD

Embodiments of the present invention relate to a technique for generating ions to be supplied to an accelerator.

BACKGROUND

In recent years, application of supplying ions to an accelerator and radiating them at high speed has been promoted in a wide range of fields such as engineering and medicine. Currently, a widely used accelerator system is mainly composed of an ion source (i.e., ion generation device), a linear accelerator, and a circular accelerator. Ions are accelerated stepwise in the order of the ion source, the linear accelerator, and the circular accelerator, and then a high-energy ion beam is radiated.

In the linear accelerator, a plurality of accelerating electric fields having opposite electric potential components next to each other are arranged in a straight line, the electric field direction is repeatedly inverted at high frequency, and ions passing through the accelerating electric fields are always accelerated only in the traveling direction. The linear accelerator based on such a principle can accelerate and emit heterogeneous ions having different mass and different charge amount due to difference in input power.

However, as a condition, kinetic energy per nucleon of the incident ion is required to match the specifications of the incident energy of the linear accelerator. When this condition is satisfied, heterogeneous ions having different mass-to-charge ratio can be accelerated so as to be emitted at an energy that matches the specifications of the emission energy of the linear accelerator.

Thus, for a plurality of ion sources and a plurality of circular accelerators, the system can be constructed with one linear accelerator. In this system, heterogeneous ions generated by each ion source are made incident on the linear accelerator at different timings. Each of the heterologous ions emitted from the linear accelerator is distributed to individual circular accelerators and further accelerated. In this manner, different types of ion beams can be obtained separately with high energy, and experimental and therapeutic ion beams can be efficiently supplied.

PRIOR ART DOCUMENT

Patent Document

[NON-Patent Document 1] Y. Kageyama, et al., "Present Status of HIMAC injectors at NIRS", Proceedings of the 7th Annual Meeting of Particle Accelerator Society of Japan (2010) 1135-1138.

SUMMARY

Problems to be Solved by Invention

However, the above-described known ion beam supply facility needs to prepare a plurality of ion sources for each required beam type. Including a plurality of beam transport paths and transport-path switching devices from each ion source to the linear accelerator, the known ion beam supply facility becomes a large-scale system as a whole. In addition, advanced control technology is also required for allowing heterogeneous ions generated by each of the plurality of ion sources to be made incident on the linear accelerator at different timings.

In view of the above-described circumstances, embodiments of the present invention aim to provide an ion generation technique for outputting heterologous ions having the same per-nucleon energy at different timings with the use of one ion source.

BRIEF DESCRIPTION OF DRAWINGS

FIG. 2 illustrates mathematical expressions indicating the principle of ion separation in the ion generation device according to each embodiment.

FIG. 3A is a graph showing an operation timing of a request signal receiver.

FIG. 3B is a graph showing an operation timing of an electric-field voltage adjuster.

FIG. 3C is a graph showing an operation timing of an excitation-current adjuster.

FIG. 3D is a graph showing an operation timing of an ion generation energy supplier.

FIG. 3E is a graph showing a timing of high-frequency power to be inputted to a linear accelerator.

DETAILED DESCRIPTION

First Embodiment

Figure 1:
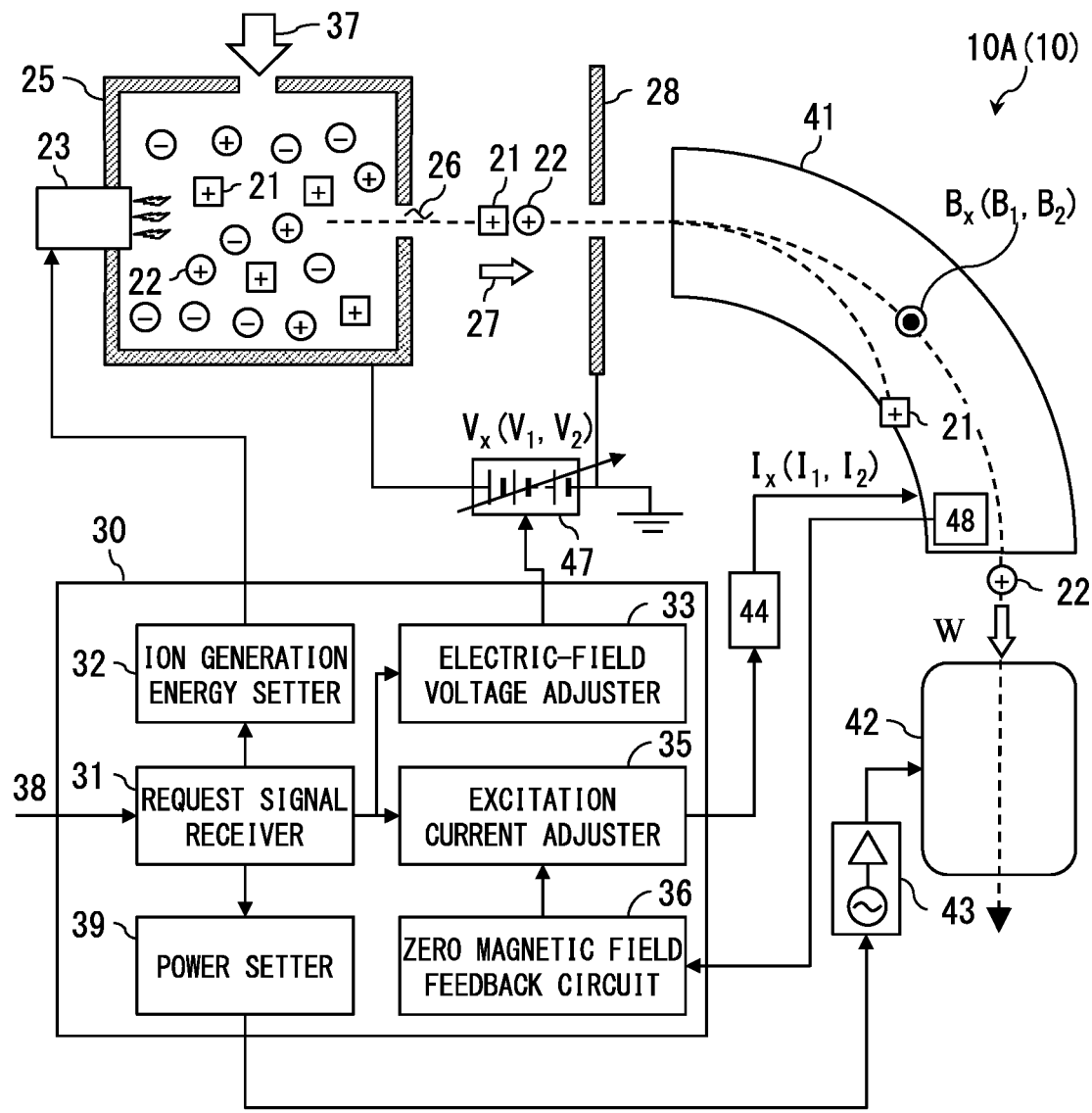
FIG. 1 is a configuration diagram illustrating an ion generation device according to the first embodiment of the present invention.

Hereinafter, embodiments of the present invention will be described by referring to the accompanying drawings. FIG. 1 is a configuration diagram illustrating the ion generation device 10A according to the first embodiment of the present invention. The ion generation device 10 includes: an ion generation energy setter 32 configured to cause the first ions 21 and second ions 22, both of which are generated by ionization in a vacuum chamber 25, to be emitted in a mixed state from an opening 26; an electric-field voltage adjuster 33 configured to impart the same predetermined per-nucleon energy to each of the first ions 21 and the second ions 22 by applying an electric potential 27 to be formed between the opening 26 and the extraction electrodes 28 in such a manner that the electric potential 27 is switched between the first electric-field voltage $V_1$ and the second electric-field voltage $V_2$; and an excitation current adjuster 35 configured to cause the first ions 21 and the second ions 22 to be outputted at different timings by supplying a coil (not shown) of a separation electromagnet 41 with an excitation current in such a manner that the excitation current is switched between the first excitation current $I_1$ and the second excitation current $I_2$.

The first ions 21 and second ions 22, both of which are generated by ionization with the use of an ion generation energy supplier 23 in the vacuum chamber 25, are emitted in a mixed state from the opening 26 by the electric potential 27 that acts between the vacuum chamber 25 and the extraction electrodes 28 by a variable power supply 47.

The ion generation energy setter 32 can switch the output intensity of the ion generation energy supplier 23 depending on the timing at which the first ions 21 and the second ions 22 are outputted.

The generation amount and ratio of the first ions 21 and second ions 22 differ depending on the output intensity of the ion generation energy supplier 23, and thus, it is effective to switch it to the output setting value at which a large amount of selected ions are generated. The output can be changed at each timing from the ion generation energy setter 32 to the ion generation energy supplier 23.

The ion generation device 10 further includes a power setter 39 that switches the intensity of the high-frequency power to be supplied to the linear accelerator 42 depending on the timing at which the first ions 21 and the second ions 22 are outputted.

In some cases, the optimum high-frequency powers $P_{rf1}$ and $P_{rf2}$ to the linear accelerator 42 differ due to the difference in mass-to-charge ratio A/Z between the first ions 21 and the second ions 22. In such a case, the power setter 39 sets each of the high-frequency powers $P_{rf1}$ and $P_{rf2}$ depending on the first ions 21 and second ions 22 to be outputted.

The vacuum chamber 25 is provided with the ion generation energy supplier 23 that converts a raw material 37 introduced from the outside into plasma. In this vacuum chamber 25, neutral particles, electrons, and positive ions (first ions 21 and second ions 22) are generated in a mixed state. As a known aspect of the ion generation energy supplier 23 configured to convert the raw material into plasma, a laser irradiation type ion source and a high-frequency (including microwave) irradiation type such as an ECR (Electron Cyclotron Resonance) ion source and a PIG (Penning Ionization Gauge) ion source are included. However, the ion generation energy supplier 23 is not limited to the above-described known ion sources.

A positive potential is applied to this vacuum chamber 25 by the variable power supply 47 to form the electric potential 27 between the outside and the closest extraction electrode 28. The raw material 37 to be introduced into the vacuum chamber 25 can be any of gas, liquid and solid, is not limited to those composed of a single element, and molecular compounds and various mixtures thereof can be used.

The population of the first ions 21 and the second ions 22 is accelerated by extraction of ions from the plasma under the electric potential 27, which acts between the vacuum chamber 25 and the extraction electrodes 28 by the variable power supply 47, so as to advance in the direction towards the extraction electrodes 28, and then is introduced into the separation electromagnet 41.

FIG. 2 illustrates mathematical expressions indicating the principle of the ion separation in the ion generation device 10 according to the embodiment. As shown in Expression (1) in FIG. 2, when an ion with a charge amount of $q_x$ is introduced into the electric field 27 formed by the electric-field voltage $V_x$, energy $W_x$ is given to this ion. The energy $W_x$ given to this ion is represented by the product of the mass number $A_x$ of the ion and the per-nucleon energy w. The charge amount $q_x$ of the ion is represented by the product of the elementary charge e and the valence $Z_x$ of the ion.

As shown in Expression (2) in FIG. 2, when it is expressed by the mass-to-charge ratio $A_1/Z_1$ of the first ion 21, the mass-to-charge ratio $A_2/Z_2$ of the second ion 22, and the elementary charge e, in order to give the predetermined per-nucleon energy w, it is required to form the electric potential 27 by causing the variable power supply 47 to apply the electric-field voltage $V_1$ for the case of the first ions 21 and the electric-field voltage $V_2$ for the case of the second ions 22. The per-nucleon energy w given by the electric potential 27 is predetermined in accordance with the incident energy specified as the specifications of the linear accelerator 42 in the subsequent stage.

Returning to FIG. 1, the first and second ions 21 and 22, to which the predetermined per-nucleon energy w is imparted by causing the variable power supply 47 to switch the electric-field voltage $V_x$ between $V_1$ and $V_2$ and to apply the electric-field voltage $V_x$, are introduced into the separation electromagnet 41 at different timings. With the switching of the electric-field voltage $V_x$ ($V_1$, $V_2$), the second ions 22 at the application timing of the electric-field voltage $V_1$ and the first ions 21 at the application timing of the electric-field voltage $V_2$ are also supplied with energy different from the predetermined per-nucleon energy w so as to be introduced into the separation electromagnet 41.

The separation electromagnet 41 exerts the action of applying Lorentz force and bending the orbit of passing ions by the magnetic field $B_x$ that is generated by causing the excitation current $I_x$ to flow through the coil. When the first excitation current $I_1$ is supplied to this separation electromagnet 41, the first excitation magnetic field $B_1$ is excited. When the second excitation current $I_2$ is supplied to this separation electromagnet 41, the second excitation magnetic field $B_2$ is excited.

As shown in Expressions (3) and (4) in FIG. 2, each ion having a mass $M_x$ and being supplied with energy $W_x$ is made incident on the separation electromagnet 41 at a speed $v_x$. Note that the mass $M_x$ of an ion is represented by the product of the nucleon mass m and the mass number $A_x$ of the ion.

As shown in Expression (5) in FIG. 2, each ion draws a circular orbit with a radius R under the Lorentz force F that is received from the magnetic field $B_x$ and acts as a centripetal force. Thus, as is expressed by replacing x in Expression (6) in FIG. 2 by 1 or 2, the first and second ions 21 and 22, which are supplied with the predetermined per-nucleon energy w and have a mass-to-charge ratio $A_x/Z_x$, can selectively pass through the separation electromagnet 41 having a radius R of curvature by adjusting the separation electromagnet 41 to the magnetic field $B_x$.

Returning to FIG. 1, the first and second ions 21 and 22, to which the predetermined per-nucleon energy w is applied, are introduced into the linear accelerator 42 at different timings by causing the separation electromagnet 41 to switch the magnetic field $B_x$ between $B_1$ and $B_2$ and to apply the magnetic field $B_x$. The first and second ions 21 and 22, to which energy different from the predetermined per-nucleon energy w is imparted, draw an orbit different from the radius R of curvature of the separation electromagnet 41, and thus, cannot reach the linear accelerator 42.

As one aspect, a description will be given of a case where methane gas ($CH_4$) is used as the raw material 37. Consider a case where methane gas ($CH_4$) is converted into plasma in the vacuum chamber 25 to generate carbon ions $^{12}C^{4+}$ and hydrogen molecule ions $H_2^+$. Each carbon ion $^{12}C^{4+}$ has a mass number A of 12 and a valence Z of 4, and thus, its mass-to-charge ratio A/Z is 3. The hydrogen molecule ion $H_2^+$ has a mass number A of 2 and a valence Z of 1, and thus, its mass-to-charge ratio A/Z is 2.

The electric-field voltage to be generated by the variable power supply 47 and required for the carbon ion $^{12}C^{4+}$ to obtain the per-nucleon energy w at the electric potential 27 is expressed by $V_{C4+}=3w/e$ (Equation (2) in FIG. 2). Similarly, the electric field voltage required for the hydrogen molecule ion $H_2^+$ to obtain the per-nucleon energy w is represented by $V_{H2+}=2w/e$. Thus, the variable power supply 47 selectively applies the electric-field voltage $V_{C4+}$ and the electric-field voltage $V_{H2+}$ to the vacuum chamber 25 at each timing in response to the request signal from the electric-field voltage adjuster 33.

The excitation magnetic field $B_{C4+}$ required for the carbon ion $^{12}C^{4+}$ with per-nucleon energy w to pass through the separation electromagnet 41 having a radius R is expressed by $B_{C4+}=3\times\sqrt{(2mw)}/eR$ (Expression (6) in FIG. 2). The excitation magnetic field required for the hydrogen molecule ion $H_2^+$ with per-nucleon energy w to pass through the separation electromagnet 41 having a radius R is expressed by $B_{C4+}=2\times\sqrt{(2mw)}/eR$ (Expression (6) in FIG. 2).

The linear accelerator 42 arranges a plurality of accelerating electric fields having opposite electric potential components next to each other in a straight line and repeatedly inverts the electric field direction at a high frequency so as to accelerate the ions passing through the accelerating electric fields only in the traveling direction every time. The first and second ions 21 and 22 having the per-nucleon energy w, which matches the specifications of the incident energy of the linear accelerator 42, are made incident on the linear accelerator 42, and are accelerated when the high-frequency powers $P_{rf1}$ and $P_{rf2}$ required for the ions having a mass-to-charge ratio A/Z are applied.

In some cases, the optimum high-frequency powers $P_{rf1}$ and $P_{rf2}$ differ due to the difference in mass-to-charge ratio A/Z between the first ion 21 and the second ion 22. In such a case, a setting change signal is sent from the power setter 39 of the linear accelerator 42 to the high frequency power supply 43 at each timing. The high frequency power supply 43 outputs the high frequency powers $P_{rf1}$ and $P_{rf2}$ having been set for each timing to the linear accelerator 42. The first and second ions 21 and 22 accelerated by the linear accelerator 42 are emitted after being increased to the energy specified in the specifications.

The controller 30 includes at least: a request signal receiver 31; the ion generation energy setter 32; the electric-field voltage adjuster 33; the excitation current adjuster 35; a zero magnetic field feedback circuit 36; and a linear-accelerator power setter 39. This controller 30 is a general computer processor that can implement the functions of each element and can be operated by a computer program.

FIG. 3A is a graph showing an operation timing of the request signal receiver 31. The request signal receiver 31 inputs a request signal 38, which is a trigger for ion generation in the ion generation device 10, from an external timing system (not shown).

FIG. 3B is a graph showing an operation timing of the electric-field voltage adjuster 33. The electric-field voltage adjuster 33 applies the first electric-field voltage $V_1$ as the initial setting value to the vacuum chamber 25 only for the predetermined time T1 in response to the reception of the request signal 38. After the elapse of this predetermined time T1, the first electric-field voltage $V_1$ is changed to the second electric-field voltage $V_2$. In response to the reception of the next request signal 38, the second electric-field voltage $V_2$ is applied only for the predetermined time T1. Although the transition of the first electric-field voltage $V_1$ to the second electric-field voltage $V_2$ and the opposite transition are illustrated as a gradient change, the transition method is not limited to this.

Further, after the elapse of this predetermined time T1, the second electric-field voltage $V_2$ is increases so as to be changed to the first electric-field voltage $V_1$. The first electric-field voltage $V_1$ and the second electric-field voltage $V_2$ are switched and applied to the vacuum chamber 25 in this manner to form the electric field 27, and thereby, the same predetermined per-nucleon energy w is applied to each of the first ions 21 and the second ions 22 at different timings. Although the transition of the first electric-field voltage $V_1$ to the second electric-field voltage $V_2$ and the opposite transition are illustrated as a gradient change, the transition method is not limited to this.

FIG. 3C is a graph showing an operation timing of the excitation current adjuster 35. The excitation current adjuster 35 supplies the first excitation current $I_1$ to the separation electromagnet 41 only for the predetermined time T2 in response to the reception of the request signal 38 after the elapse of the preset delay time D2. After the elapse of the predetermined time T2, the first excitation current $I_1$ is set to zero. The delay time D2 and the predetermined time T2 are set as time sufficient for the current value having been set to stabilize in a flat state.

Further, the excitation current adjuster 35 supplies the second excitation current $I_2$ to the separation electromagnet 41 only for the predetermined time T2 in response to the reception of the next request signal 38 after the elapse of the delay time D2. After the elapse of the predetermined time T2, the second excitation current $I_2$ is set to zero. In this manner, on the basis of the request signal 38 to be received intermittently, the excitation current adjuster 35 supplies the excitation current to the coil (not shown) of the separation electromagnet 41 in such a manner that the excitation current to be applied to the coil is switched between the first excitation current $I_1$ and the second excitation current $I_2$.

FIG. 3D is a graph showing an operation timing and output of the ion generation energy supplier 23. A timing signal for generating ions is transmitted from the ion generation energy setter 32 to the ion generation energy supplier 23. The ion generation energy setter 32 controls the ion generation energy supplier 23 such that the ion generation energy supplier 23 operates with the output time T3 and output intensity having been set after the elapse of the preset delay time D3.

Energy is supplied from the ion generation energy supplier 23 to the raw material 37 in the vacuum chamber 25, and the first ions 21 and the second ions 22 are generated in a mixed state for the output time T3. The efficiency of each ion production amount is improved by changing $P_{MW1}$ for each timing in the case of selecting the first ions 21 and by changing $P_{MW2}$ for each timing in the case of selecting the second ions 22.

On the basis of the request signal 38 to be received intermittently, the first and second ions 21 and 22 having the predetermined per-nucleon energy w are outputted at different timings by switching between first electric-field voltage $V_1$ and the second electric-field voltage $V_2$ and switching between the first excitation current $I_1$ and the second excitation current $I_2$ in this manner.

The first ions 21 or the second ions 22 outputted by the separation electromagnet 41 in this manner are made incident on the linear accelerator 42 with the predetermined per-nucleon energy w. As to the power to be inputted to the linear accelerator 42, the optimum high-frequency powers $P_{rf1}$ and $P_{rf2}$ differ due to the difference in mass-to-charge ratio A/Z between the first ion 21 and the second ion 22. Accordingly, a setting signal is sent from the power setter 39 of the linear accelerator 42 to the high frequency power supply 43 at each timing.

The high frequency powers $P_{rf1}$ and $P_{rf2}$ having been set are inputted to the linear accelerator from the high frequency power supply 43 at each timing of the first ions 21 and the second ions 22 (FIG. 3E). Consequently, the first and second ions 21 and 22 having different mass-to-charge ratios A/Z are accelerated in the linear accelerator 42 at each timing and are emitted after being increased to the energy specified in the specifications.

Figure 4A:
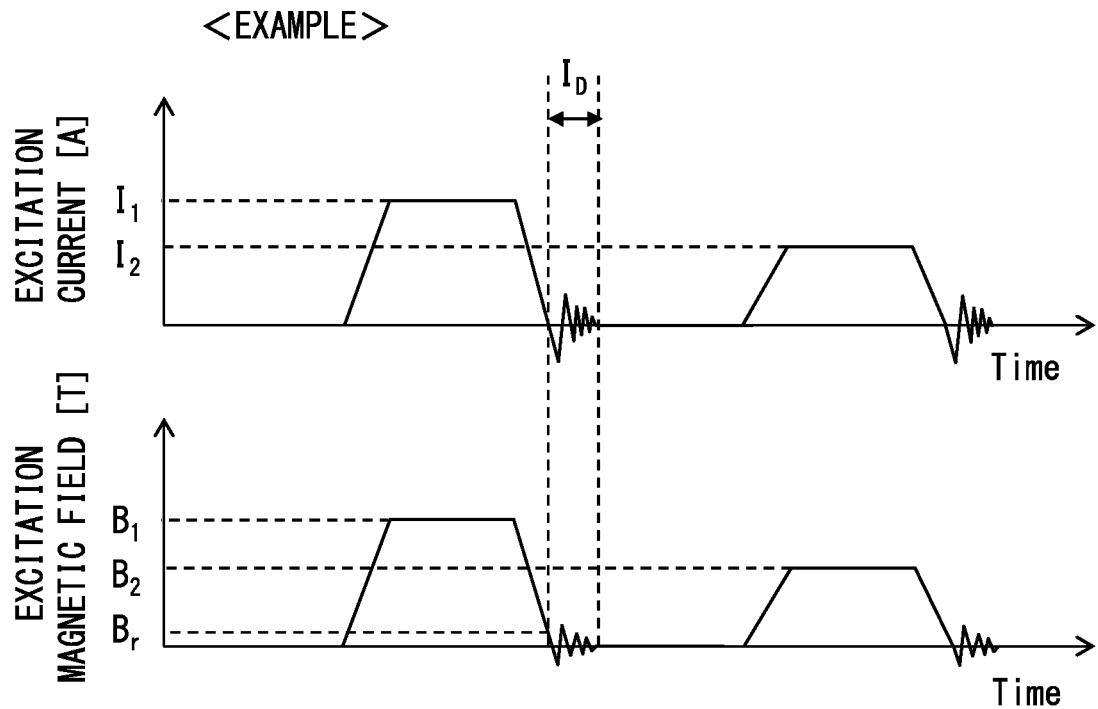
FIG. 4A is a graph showing a process of eliminating the residual magnetic field (i.e., relic magnetic field) of an iron core by a zero magnetic field feedback circuit in an example.

FIG. 4A is a graph showing a process of eliminating the residual magnetic field $B_r$ of the iron core by the zero magnetic field feedback circuit 36, the excitation power supply 44, and the magnetic field detector 48 as an example of operating the separation electromagnet 41. When switching between first excitation current $I_1$ and the second excitation current $I_2$ in the excitation current adjuster 35, the zero magnetic field feedback circuit 36 detects the residual magnetic field $B_r$ from the magnetic field detector 48, controls the excitation power supply 44 such that the residual magnetic field $B_r$ becomes zero, and supplies the demagnetization current $I_D$ to the coil of the separation electromagnet 41 so as to demagnetize the residual magnetic field $B_r$ of the iron core (not shown) of the separation electromagnet 41 to zero.

Figure 4B:
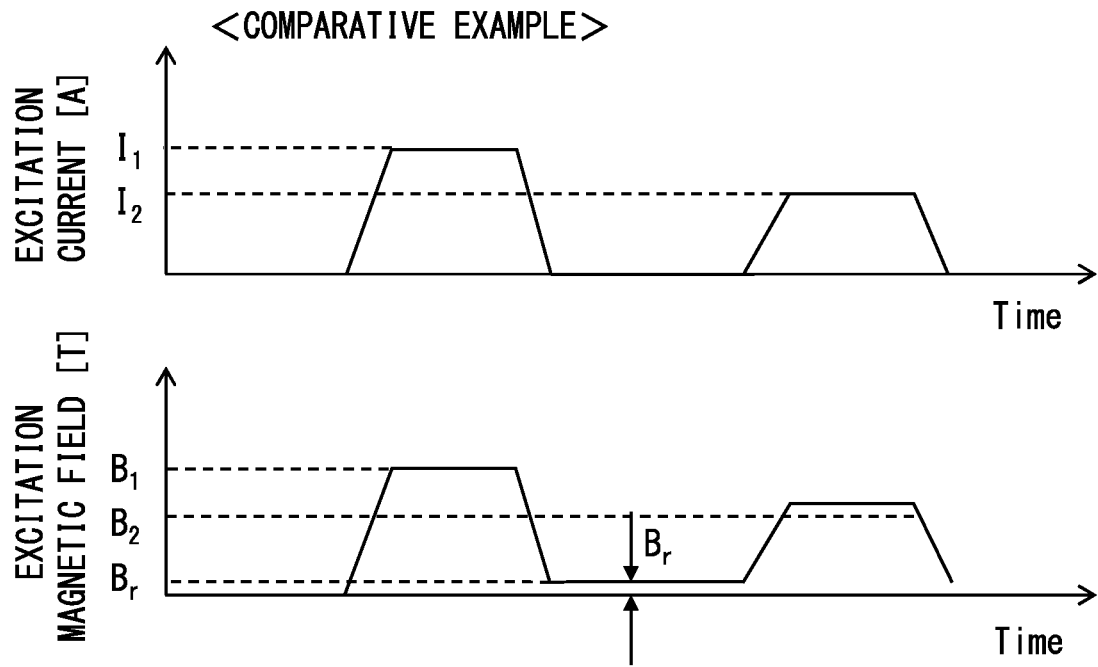
FIG. 4B is a graph showing the residual magnetic field of the iron core to be generated at the time of exciting the separation electromagnet in a comparative example in which the zero magnetic field feedback circuit is not provided.

FIG. 4B is a graph showing the residual magnetic field $B_r$ of the iron core to be generated at the time of exciting the separation electromagnet 41 in a comparative example in which the zero magnetic field feedback circuit 36 is not provided. Even when the excitation current is returned to 0 ampere after causing the separation electromagnet 41 to generate the magnetic field $B_1$ with the first excitation current $I_1$, the residual magnetic field $B_r$ due to magnetic hysteresis remains in the iron core, and thus, the magnetic field B does not return to 0 tesla. When this residual magnetic field $B_r$ is left as it is and the separation electromagnet 41 is excited by switching the excitation current to the second excitation current $I_2$, the second magnetic field to be generated includes an error.

As described above, if the residual magnetic field $B_r$ is left as it is, a small magnetic field to be generated after generating a large magnetic field in the separation electromagnet 41 tends to have a large error. Thus, when the excitation current is switched, it is desirable that the residual magnetic field $B_r$ disappears infallibly.

Figure 5:
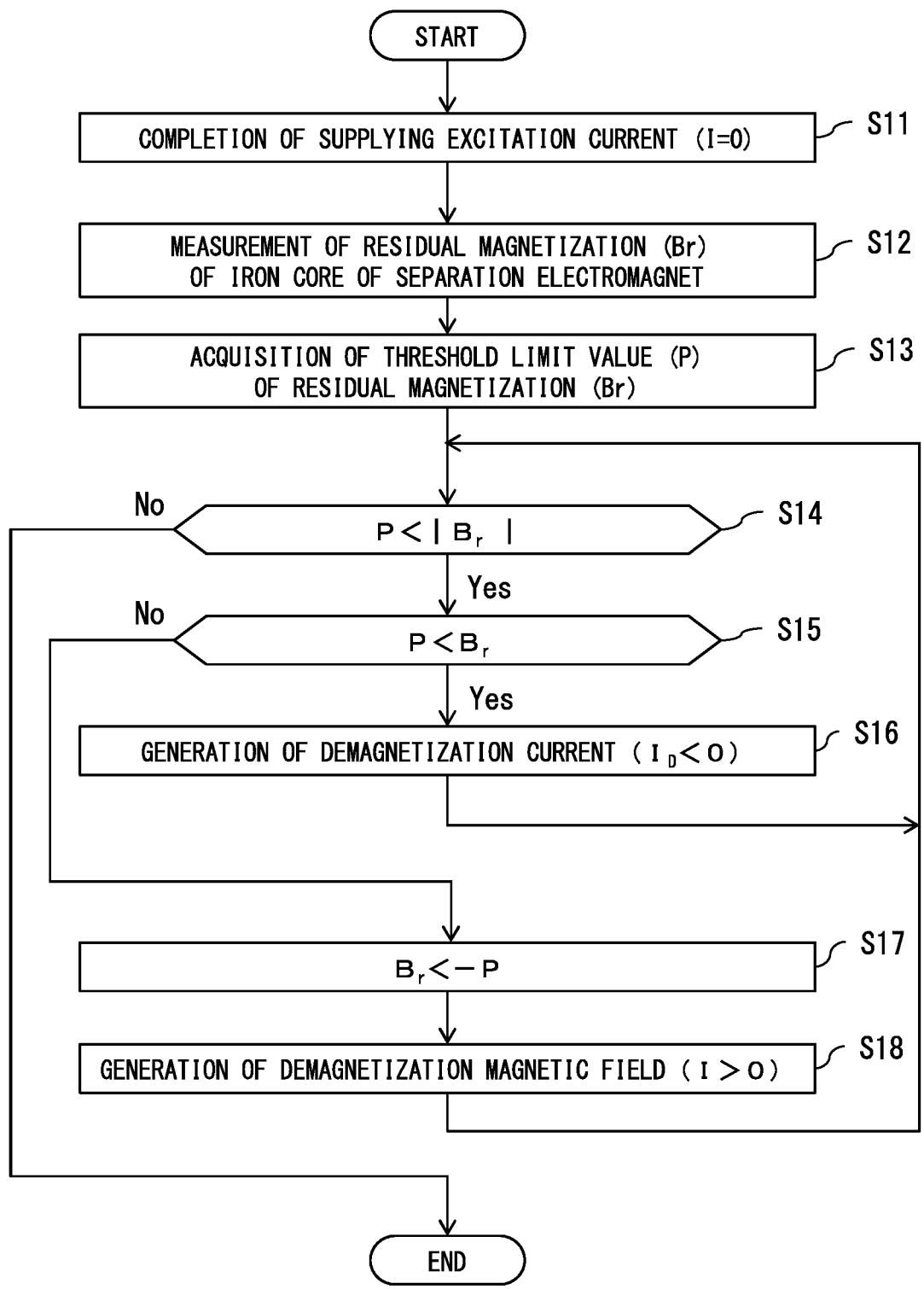
FIG. 5 is a flowchart showing control of a demagnetization current for demagnetizing the residual magnetic field generated in the iron core.

FIG. 5 is a flowchart showing control of a demagnetization current to be performed by the zero magnetic field feedback circuit 36 that eliminates the residual magnetic field generated in the iron core to zero. When the supply of the excitation current ends and the current value I becomes 0 amperes in the step S11, the residual magnetic field $B_r$ of the iron core of the separation electromagnet 41 is measured by the magnetic field detector 48 in the step S12. After this, the threshold limit value P of the residual magnetic field $B_r$ is acquired and compared with the measured value of the residual magnetic field $B_r$ in the steps S13 and S14. If the absolute value of the measured residual magnetic field $B_r$ exceeds the threshold limit value P (Yes in the step S14), it is determined to be abnormal. The magnetic field detector 48 is a Gauss meter or the like.

If the residual magnetic field $B_r$ exceeds the threshold limit value P in the positive direction (Yes in the step S15), the demagnetization current $I_D$ that generates a magnetic field in the negative direction is supplied in the step S16, and the residual magnetic field $B_r$ is measured again and compared with the threshold limit value P in the step S14.

If the residual magnetic field $B_r$ exceeds the threshold limit value P in the negative direction (No in the step S15 and in the step S17), the demagnetization current $I_D$ that generates a magnetic field in the positive direction is supplied in the step S18, and the residual magnetic field $B_r$ is measured again and compared with the threshold limit value P in the step S14.

If the absolute value of the measured residual magnetic field $B_r$ is within the range of the threshold limit value P (No in the step S14), it is determined to be normal.

Second Embodiment

Figure 6:
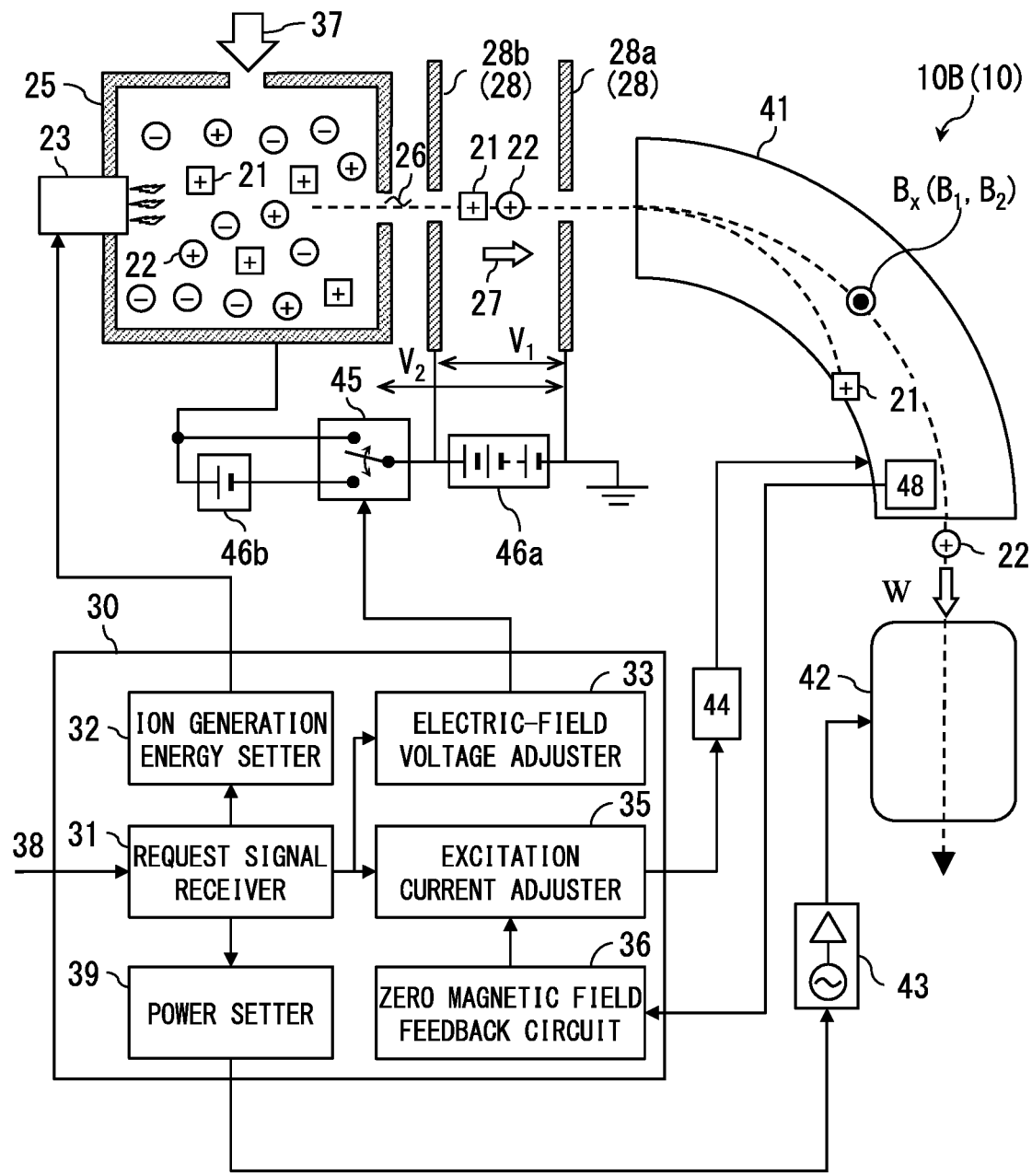
FIG. 6 is a configuration diagram illustrating an ion generation device according to the second embodiment of the present invention.

Next, the second embodiment of the present invention will be descried by referring to FIG. 6. FIG. 6 is a configuration diagram illustrating the ion generation device 10B according to the second embodiment of the present invention. In FIG. 6, components having the same configuration or function as those in FIG. 1 are denoted by the same reference signs, and duplicate description is omitted.

In the ion generation device 10B according to the second embodiment, the extraction electrodes 28 are composed of a first electrode 28a and a second electrode 28b. The first electrode 28a and the second electrode 28b are connected via a first fixed power supply 46a. The second electrode 28b and the vacuum chamber 25 are connected via a second fixed power supply 46b and a switch 45.

As to the electric potential 27, the switch 45 switches between the first electric-field voltage $V_1$ to be applied from the first electrode 28a to the second electrode 28b and the second electric-field voltage $V_2$ to be applied from the first electrode 28a to the vacuum chamber 25.

With the use of the switch 45 provided in the circuit connecting the second electrode 28b to the vacuum chamber 25, the electric-field voltage adjuster 33 can switch between a circuit via the second fixed power supply 46b and a path that does not pass through the second fixed power supply 46b. Accordingly, the electric-field voltage adjuster 33 can switch the electric potential 27 to either one of the first electric-field voltage $V_1$ and the second electric-field voltage $V_2$ by switching the switch 45.

Figure 7:
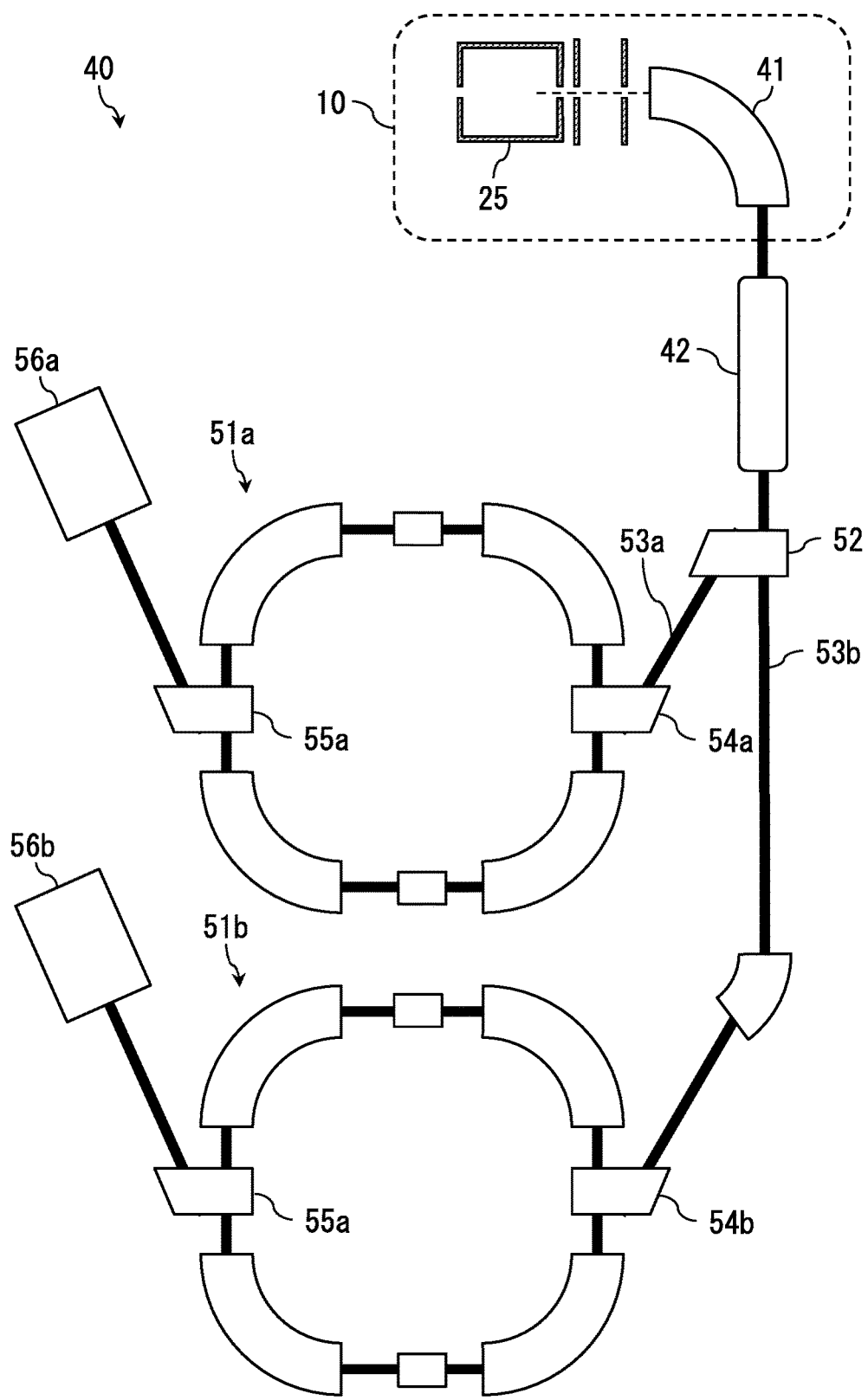
FIG. 7 is a configuration diagram of an accelerator system to which the ion generation device according to the embodiment is applied.

FIG. 7 is a configuration diagram of an accelerator system 40 to which the ion generation device 10 according to the embodiment is applied. In FIG. 7, components having the same configuration or function as those in FIG. 1 are denoted by the same reference signs, and duplicate description is omitted. The accelerator system 40 includes a distributor 52 that distributes the first and second ions 21 and 22 accelerated by the linear accelerator 42 to individual transport paths 53 (53a, 53b). In the subsequent stage of the distributor 52, incident devices 54 (54*a*, 54*b*) and circular accelerators 51 (51*a*, 51*b*) for accelerating ions are provided, and the ions are used by utilization devices 56 (56*a*) via emission devices 55 (55*a*, 55*b*).

From the linear accelerator 42, the first ions 21 and the second ions 22 are outputted at different timings. The distributor 52 leads the first ions 21 to the first transport path 53*a* at the timing when the first ions 21 pass, and leads the second ions 22 to the second transport path 53*b* at the timing when the second ions 22 pass. Thereafter, the first ions 21 are further energized at the first circular accelerator 51*a*, and the second ions 22 are further energized at the second circular accelerator 51*b*. As a result, one ion generation device 10 can separately radiate a plurality of high-energy ion beams in the utilization devices 56 (56*a*, 56*b*).

According to the ion generation device of at least one embodiment described above, the ion generation device generates heterogeneous ions, applies the electric-field voltage to the accelerating electric field while switching this electric-field voltage, supplies the excitation current to the separation electromagnet while switching this excitation current, and thus, can output heterogeneous ions with the same per-nucleon energy at different timings by using one ion source.

While certain embodiments have been described, these embodiments have been presented by way of example only, and are not intended to limit the scope of the inventions. These embodiments may be embodied in a variety of other forms, and various omissions, substitutions, and changes may be made without departing from the spirit of the inventions. These embodiments and their modifications are included in the accompanying claims and their equivalents as well as included in the scope and gist of the inventions.

The invention claimed is:

1. An ion generation device comprising:
   an ion generation energy setter configured to cause first ions and second ions to be emitted in a mixed state from an opening, the first ions and the second ions being generated by ionization in a vacuum chamber while switching output intensity of an ion generation energy supplier;
   an electric-field voltage adjuster configured to impart a predetermined same per-nucleon energy to each of the first ions and the second ions by applying an electric potential to be formed between the opening and at least one extraction electrode in such a manner that the electric potential is switched between a first electric-field voltage and a second electric-field voltage depending on switching of the output intensity; and
   an excitation current adjuster configured to cause the first ions and the second ions to be outputted at different timings by supplying a coil of a separation electromagnet with an excitation current in such a manner that the excitation current is switched between a first excitation current and a second excitation current depending on switching of the output intensity.

2. The ion generation device according to claim 1, further comprising:
   a linear accelerator configured to accelerate the first ions and the second ions that are made incident at different timings; and
   a power setter configured to switch intensity of high-frequency power to be supplied to the linear accelerator depending on timing.

3. The ion generation device according to claim 1, further comprising a zero magnetic field feedback circuit configured to eliminate a residual magnetic field of an iron core of the separation electromagnet by supplying a demagnetization current to the coil when switching between the first excitation current and the second excitation current is performed.

4. The ion generation device according to claim 1, further comprising a linear accelerator configured to accelerate the first ions and the second ions that are made incident at different timings,
   wherein the same per-nucleon energy corresponds to incident energy that is specified as specifications of the linear accelerator.

5. The ion generation device according to claim 1, further comprising:
   a linear accelerator configured to accelerate the first ions and the second ions that are made incident at different timings; and
   a distributor configured to distribute the first ions and the second ions accelerated by the linear accelerator to individual transport paths.

6. The ion generation device according to claim 1, further comprising a switch, wherein:
   the at least one extraction electrode comprises a first electrode and a second electrode; and
   the switch is configured to switch the electric potential between a first electric-field voltage to be applied from the first electrode to the second electrode and a second electric-field voltage to be applied from the first electrode to the vacuum chamber.

7. An ion generation method comprising:
   emitting first ions and second ions in a mixed state from an opening, the first ions and second ions being generated by ionization in a vacuum chamber while switching output intensity of an ion generation energy supplier;
   imparting a same predetermined per-nucleon energy to each of the first ions and the second ions by applying an electric potential to be formed between the opening and an extraction electrode in such a manner that the electric potential is switched between a first electric-field voltage and a second electric-field voltage depending on switching of the output intensity; and
   outputting the first ions and the second ions at different timings by supplying a coil of a separation electromagnet with an excitation current in such a manner that the excitation current is switched between a first excitation current and a second excitation current depending on switching of the output intensity.

8. A non-transitory computer-readable medium storing executable instructions that allow a computer to perform:
   an emitting process of causing first ions and second ions to be emitted in a mixed state from an opening, the first ions and second ion being generated by ionization in a vacuum chamber while switching output intensity of an ion generation energy supplier;
   an imparting process of imparting a same predetermined per-nucleon energy to each of the first ions and the second ions by applying an electric potential to be formed between the opening and an extraction electrode in such a manner that the electric potential is switched between a first electric-field voltage and a second electric-field voltage depending on switching of the output intensity; and
   an outputting process of causing the first ions and the second ions to be outputted at different timings by supplying a coil of a separation electromagnet with an excitation current in such a manner that the excitation current is switched between a first excitation current and a second excitation current depending on switching of the output intensity.

\* \* \* \* \*